United States Patent
Hung et al.

(10) Patent No.: US 6,639,836 B1
(45) Date of Patent: Oct. 28, 2003

(54) METHOD FOR READING FLASH MEMORY WITH SILICON-OXIDE/NITRIDE/OXIDE-SILICON (SONOS) STRUCTURE

(75) Inventors: Chih-Wei Hung, Hsin-chu (TW); Chiu-Tsung Huang, Hsinchu (TW); Hann-Jye Hsu, Taichung Hsien (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/065,565

(22) Filed: Oct. 31, 2002

(51) Int. Cl.⁷ .............................................. G11C 16/04
(52) U.S. Cl. ........................ 365/185.18; 365/185.27; 365/185.33
(58) Field of Search ................... 365/185.18, 185.26, 365/185.27, 185.33

(56) References Cited

U.S. PATENT DOCUMENTS 5,742,541 A * 4/1998 Tanigami et al. ........ 365/185.3

* cited by examiner

Primary Examiner—Vanthu Nguyen
(74) Attorney, Agent, or Firm—Jiang Chyun IP Offices

(57) ABSTRACT

A method for reading flash memory cell with SONOS structure is disclosed. The flash memory cell with SONOS structure includes a P-well in a substrate, a tunneling oxide layer on the substrate, a charge trapping layer on the tunneling oxide layer, a dielectric layer on the charge trapping layer, a gate conductive layer on the dielectric layer, and source and drain regions in the substrate adjacent to the gate conductive layer. The flash memory cell with SONOS structure is read by applying a positive voltage to the drain region, floating the source region, grounding the P-well to generate gate induced drain leakage current and determining the gate induced drain leakage from the drain region to read the data in the memory cell.

7 Claims, 3 Drawing Sheets

METHOD FOR READING FLASH MEMORY WITH SILICON-OXIDE/NITRIDE/OXIDE-SILICON (SONOS) STRUCTURE

BACKGROUND OF INVENTION

1. Field of the Invention

The present invention relates to a method for reading a flash memory cell. More particularly, the present invention relates to a method for reading a flash memory cell with silicon-oxide/nitride/oxide-silicon (SONOS) structure.

2. Background of the Invention

The memory device is a semiconductor device used for storing information or data. When the functions of the microprocessor increase and a large amount of programs and operations are required to be executed by the software, the demand for the memory increases. For fabricating high-capacity and inexpensive memory to satisfy this demand, fabricating the memory device has become a driving force challenging high integration technique and process.

Flash memory can perform programming, erasing and reading many times and can retain information even when power is interrupted, so it is widely used in personal computers and electrical apparatus.

The typical flash cell is an erasable programmable read-only memory with tunnel oxide (ETOX) cell. The ETOX cell is programmed by channel hot-electron (CHE) and is erased by Fowler-Nordheim (F-N) tunneling through the source side.

Moreover, the floating gate and the control gate of the ETOX cell are made of doped polysilicon. The electrons injected into the polysilicon floating gate are delocalized when the memory cell is programmed. However, if there are defects in the tunneling oxide under the polysilicon floating gate of the ETOX cell, current leakage of the device occurs easily and affects reliability of the device.

Therefore, in order to solve the problem of the gate induced drain leakage current of the ETOX memory cell, a flash memory cell with silicon-oxide/nitride/oxide-silicon (SONOS) structure has been provided. The flash memory cell with SONOS structure comprises a charge trapping layer to replace the polysilicon floating gate. The charge trapping layer is made of silicon nitride between two oxide layers. When the memory cell is programmed by applying a bias to the control gate and source/drain regions, hot holes are generated at the channel adjacent to the source region and are injected into the charge trapping layer. Since the charge trapping layer is a dielectric layer, the hot holes injected into the charge trapping layer are not delocalized but are localized and have a Gauss distribution. For this reason, the sensitivity of the memory cell toward the defects in the tunneling oxide layer is smaller and the phenomenon of the gate induced drain leakage current is reduced.

However, with the flash memory cell with SONOS structure, since the electrons are localized in the charge trapping layer, current leakage easily occurs so as to make mistakes during the reading of the cell.

SUMMARY OF INVENTION

The present invention also provides a method for reading a flash memory cell with SONOS structure in order to improve the operation efficiency of the memory cell.

The present invention provides a method for reading a flash memory cell with SONOS structure. The flash memory cell with SONOS structure includes a P-well in a substrate, a tunneling oxide layer on the substrate, a charge trapping layer on the tunneling oxide layer, a dielectric layer on the charge trapping layer, a gate conductive layer on the dielectric layer, and source and drain regions in the substrate adjacent to the gate conductive layer. The flash memory cell with SONOS structure is read by applying a positive voltage to the drain region, floating the source region, grounding the P-well to generate gate induced drain leakage current and determining the gate induced drain leakage from the drain region to read the data in the memory cell.

According to the embodiment of the present invention, the flash memory cell with SONOS structure is read by applying 3 to 5V to the drain region, floating the source region, grounding the P-well to generate gate induced drain leakage current and determining the gate induced drain leakage from the drain region to read the data in the memory cell. If the charge trapping layer 104 adjacent to the drain region 114 is programmed, i.e., the charge trapping layer 104 has electrons, a large gate induced drain leakage current is detected because a large field is generated between the charge trapping layer 104 and the drain region 114. If the charge trapping layer 104 adjacent to the drain region 114 is not programmed, i.e., the charge trapping layer 104 has no electrons or has holes, only a small gate induced drain leakage current is detected because the generated field between the charge trapping layer 104 and the drain region 114 is small. Therefore, the magnitude of gate induced drain leakage current represents the digital information "one" or "zero" stored in the flash cell. Furthermore, for increasing the gate induced drain leakage (GIDL) current, a negative voltage of about −3 to −5V is applied to the gate conductive layer 108.

Since the tunneling oxide layer of the SONOS flash memory cell according to the present invention is thinner than that of the ETOX memory cell of the prior art, the electrons can more easily tunnel through the former than through the latter during the programming or erasing operation. Therefore, the present invention can improve the operation efficiency of the flash memory device.

The tunneling oxide layer is thinner, so that a low operation voltage can be used during the programming or erasing operation. Therefore, the dimension of the memory cell can be scaled down to achieve the objective of high integration.

Moreover, the magnitude of gate induced drain leakage current is related to the thickness of the tunneling oxide layer. The thinner the tunneling oxide layer, the larger the gate induced drain leakage current. For example, gate induced drain leakage current of a cell having a tunneling oxide layer with a thickness of 20 Angstroms is 1000 times than that of a cell having a tunneling oxide layer with a thickness of 90 Angstroms. Therefore, if the tunneling oxide layer is about 20 Angstroms and a bias about 3.5V is both applied to the drain region and the gate conductive layer, a micro Ampere order of gate induced drain leakage current can be detected to read the digital information stored in the flash cell.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
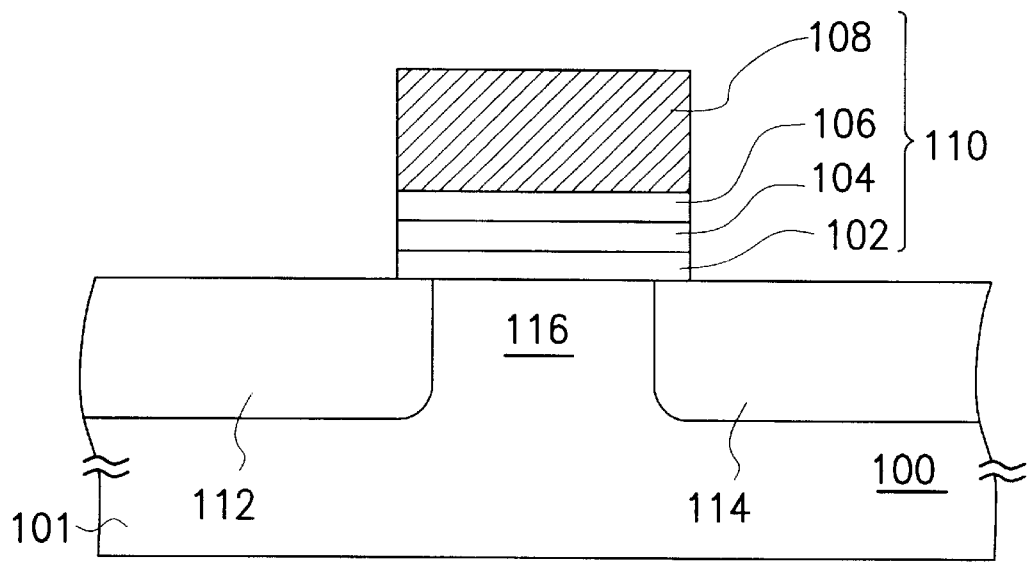
FIG. 1 illustrates a SONOS flash memory cell according to a preferred embodiment of the present invention in a cross-sectional view.

FIG. 1 illustrates the SONOS flash memory cell according to a preferred embodiment of the present invention in a cross-sectional view. Refer to FIG. 1, the SONOS flash memory cell according to a preferred embodiment of the present invention comprises a substrate 100, a P-well 101, a tunnel oxide 102, a charge trapping layer 104, a dielectric layer 106, a gate conductive layer 108, a source region 112, a drain region 114 and a channel 116.

The substrate 100 is made of, for example, silicon and the P-well 101 is formed therein.

The tunnel oxide 102 is on the substrate 100. The tunnel oxide layer 102 is formed with a thermal oxidation process, for example, and is about 20 Angstroms in thickness.

The charge trapping layer 104 on the tunneling oxide layer 102 comprises a silicon nitride layer formed by, for example, chemical vapor deposition and is about 45 angstroms in thickness.

The dielectric layer 106 on the charge trapping layer 104 comprises a silicon oxide layer formed by, for example, chemical vapor deposition and is about 35 angstroms in thickness.

The gate conductive layer 108 on the dielectric layer 106 is made of polysilicon formed by, for example, chemical vapor deposition. The stack structure including the tunneling oxide layer 102, the trapping layer 104, the dielectric layer 106 and the gate conductive layer 108 compose a gate structure 110.

The source region 112 and the drain region 114 in the substrate 100 are adjacent to and extend to the gate structure 110 in order to increase gate induced drain leakage (GIDL) current. A conductive type of the source region 112 and the drain region 114 is, for example, n-type.

Figure 2:
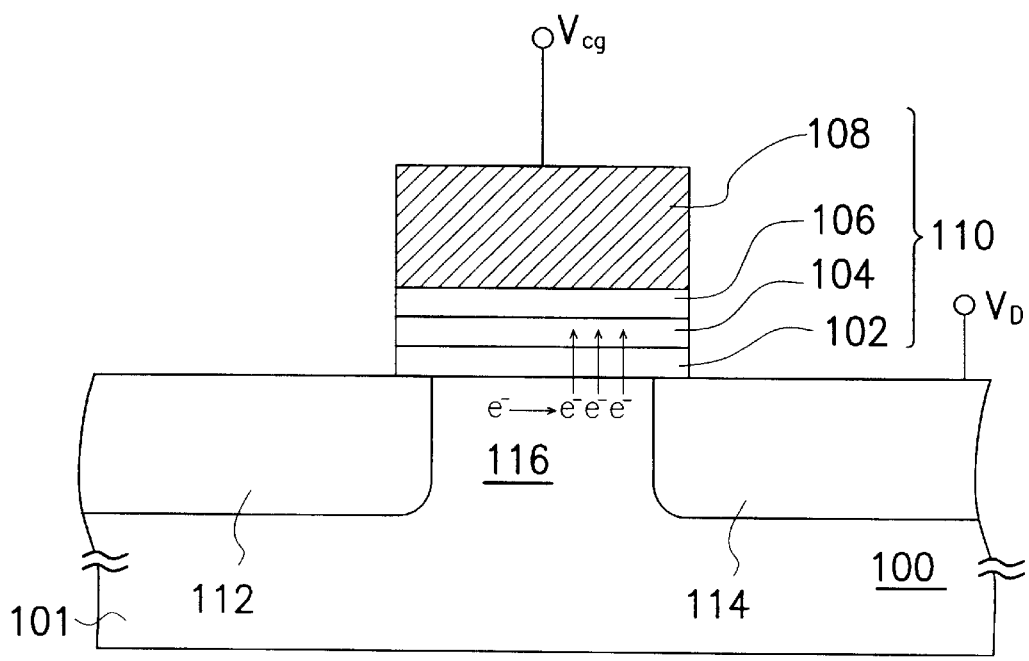
FIG. 2 illustrates a method for programming the SONOS flash memory cell according to the preferred embodiment of the present invention.
Figure 3:
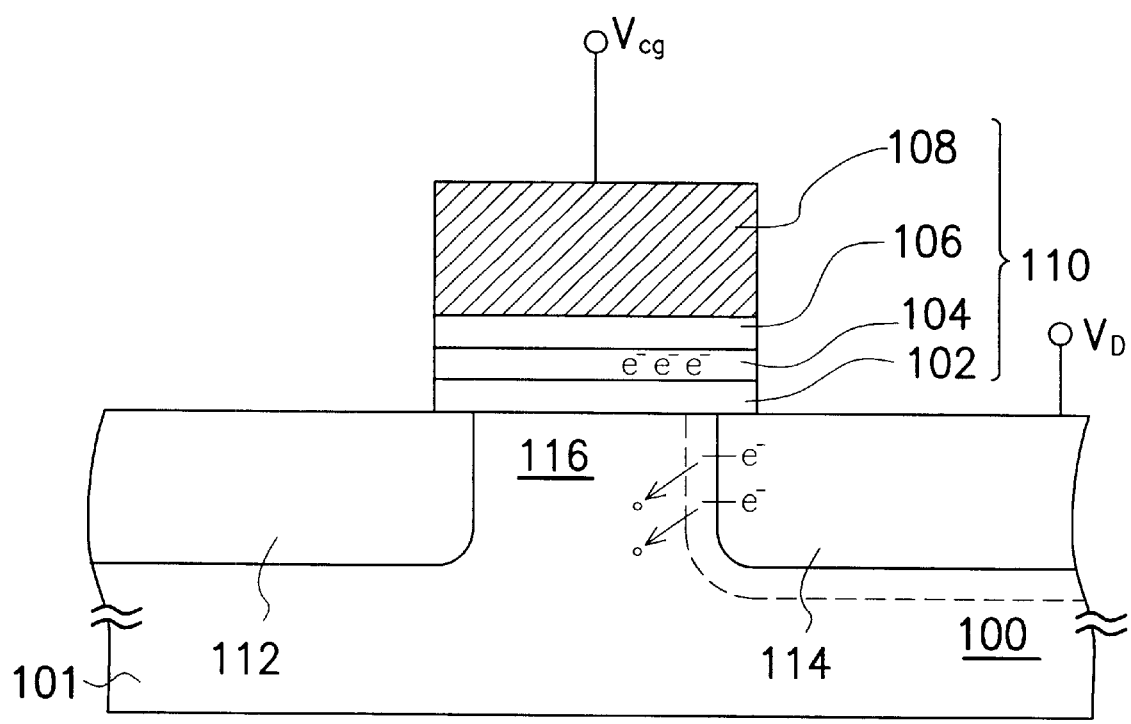
FIG. 3 illustrates a method for reading the SONOS flash memory cell according to the preferred embodiment of the present invention.
Figure 4:
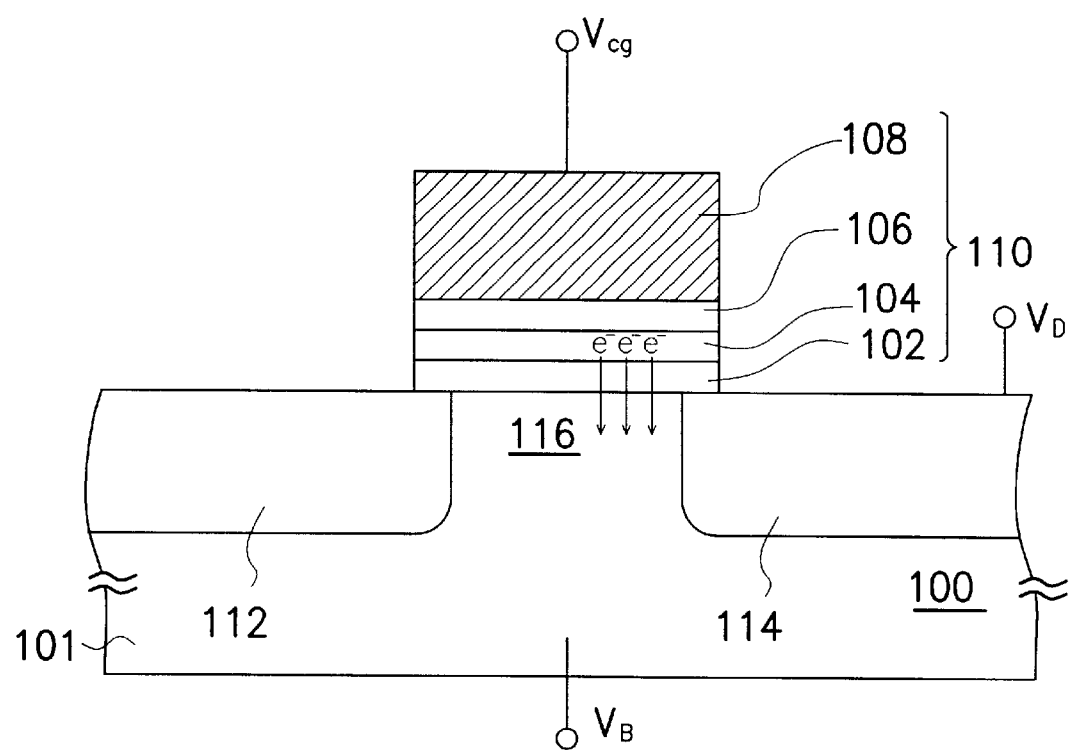
FIG. 4 illustrates a method for erasing the SONOS flash memory cell according to the preferred embodiment of the present invention.

Thereafter, a method for operating the SONOS flash memory cell according to the preferred embodiment of the present invention is described accompanying Table 1, FIGS. 2, 3 and 4. FIGS. 2, 3 and 4 illustrate a method for programming, reading and erasing the SONOS flash memory cell according to the preferred embodiment of the present invention respectively,

TABLE I

|  | Programming | Reading | Erasing |
| --- | --- | --- | --- |
| Gate | $V_{cg}$ | $-V_{cc}$ | $-V_{cg}$ |
| Source region | Ground | Floating | Floating |
| Drain region | $V_D$ | $V_{cc}$ | Floating |
| P-well | Ground | Ground | $V_B$ |

Referring to FIG. 2, during the programming of a SONOS flash memory cell, a voltage $V_{cg}$ is first applied to the gate conductive layer 108 and the P-well is grounded to turn on the channel 116. For example, $V_{cg}$ is about 6 to 12V. A voltage $V_D$, for example, 5V is applied to the drain region 114 and the source region 112 is grounded. Under these bias conditions, there is a large channel current generation. Electrons are moved from the source side to the drain side and are accelerated by the electrical field of the channel 116 to generate hot electrons. Hot electrons are injected into the charge trapping layer 104 when the energy barrier of the tunneling layer 102 is overcome and a positive bias is applied to the gate conductive layer 108 to assist. After programming, since the trapping layer 104 has net electrons therein, the cell threshold voltage $V_t$ is increased. The electrons in the trapping layer 104 will remain for a long time, unless intentionally erased.

FIG. 3 illustrates a method for reading the SONOS flash memory cell according to the preferred embodiment of the present invention. The read operation of the SONOS flash memory cell is based on the fact that gate induced drain leakage current at the source side is related to the the charge stored in the charge trapping layer 104. Gate induced drain leakage current usually occurs in a metal oxide semiconductor device with a thin oxide layer and is a current between the drain region and the substrate and/or the source region and the substrate. In the device, when a vertical electrical field at the N+ doped region adjacent to the edge of the gate is generated, holes are generated at an N+ doped region adjacent to the edge of the gate by band-to-band tunneling. When the hole current flows into the substrate, gate induced drain leakage current is detected.

Refereeing to FIG. 3, during the read operation, a bias Vcc such as 3 to 5V is applied to the drain region 114, 0V or a negative voltage -Vcc such as -3 to -5V is applied to the gate conductive layer 108, the source region 112 is floating and the P-well 101 is grounded. If the charge trapping layer 104 adjacent to the drain region 114 is programmed, i.e., the charge trapping layer 104 has electrons, a large gate induced drain leakage current is detected because a large field is generated between the charge trapping layer 104 and the drain region 114. If the charge trapping layer 104 adjacent to the drain region 114 is not programmed i.e., the charge trapping layer 104 has no electrons or has holes, only a small amount of gate induced drain leakage current is detected because the generated field between the charge trapping layer 104 and the drain region 114 is small. Therefore, the magnitude of gate induced drain leakage current represents the digital information "one" or "zero" stored in the flash cell.

FIG. 4 illustrates a method for erasing the SONOS flash memory cell according to the preferred embodiment of the present invention. Referring to FIG. 4, during the erasing operation, a voltage $V_{cg}$ such as -3 to -5V is applied to the gate conductive layer 108, a voltage $V_B$ such as 5V is applied to the P-well, and the source region 112 and the drain region 114 are both grounded. Under these bias conditions, there is a large electrical field generated between the gate conductive layer 108 and the P-well 101, so that the electrons in the charge trapping layer 104 are ejected into the channel 116.

Since the tunneling oxide layer of the SONOS flash memory cell according to the present invention is thinner than that of the ETOX memory cell of the prior art, the electrons can more easily tunnel through the former than through the latter during the programming or erasing operation. Therefore, the present invention can improve the operation efficiency of the memory device.

Furthermore, the tunneling oxide layer is thinner, so that a low operation voltage can be used during the programming or erasing operation. Therefore, the size of the memory cell can be scaled down to achieve the objective of high integration.

Moreover, the magnitude of gate induced drain leakage current is related to the thickness of the tunneling oxide layer. The thinner the tunneling oxide layer, the larger the gate induced drain leakage current. For example, the gate induced drain leakage current of a cell having a tunneling oxide layer with a thickness of 20 Angstroms is 1000 times that of a cell having a tunneling oxide layer with a thickness of 90 Angstroms. Therefore, if the tunneling oxide layer is about 20 Angstroms and a bias of about 3.5V is both applied to the drain region and the gate conductive layer, a micro ampere order of gate induced drain leakage current can be detected to read the digital information stored in the flash cell.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for reading a flash memory cell with SONOS structure, wherein the flash memory cell comprises a P-well in a substrate, a tunneling oxide layer on the substrate, a charge trapping layer on the tunneling oxide layer, a dielectric layer on the charge trapping layer, a gate conductive layer on the dielectric layer, and source and drain regions in the substrate adjacent to the gate conductive layer, the method comprising:

applying a positive voltage to the drain region, floating the source region, grounding the P-well to generate gate induced drain leakage (GIDL) current; and determining the gate induced drain leakage current from the drain region to read the data stored in the flash memory cell.

2. The method for reading a flash memory cell with SONOS structure of claim 1, wherein the positive voltage is about 3 to 5V.

3. The method for reading a flash memory cell with SONOS structure of claim 1, wherein the method further comprises a step of applying a negative voltage to the gate conductive layer.

4. The method for reading a flash memory cell with SONOS structure of claim 3, wherein the negative voltage is about −3 to −5V.

5. The method for reading a flash memory cell with SONOS structure of claim 1, wherein a thickness of the tunnel oxide layer is about 20 angstroms.

6. The method for reading a flash memory cell with SONOS structure of claim 1, wherein a thickness of the charge trapping layer is about 35 angstroms.

7. The method for reading a flash memory cell with SONOS structure of claim 1, wherein a thickness of the dielectric layer is about 45 angstroms.

* * * * *